United States Patent

Fu

[11] Patent Number: 5,963,831
[45] Date of Patent: Oct. 5, 1999

[54] METHOD OF MAKING AN INTERCONNECT STRUCTURE EMPLOYING EQUIVALENT RESISTANCE PATHS TO IMPROVE ELECTROMIGRATION RESISTANCE

[75] Inventor: Kuan-Yu Fu, Hsinchu, Taiwan

[73] Assignee: United Microelectronics Corp., Taiwan

[21] Appl. No.: 09/294,981

[22] Filed: Apr. 19, 1999

Related U.S. Application Data

[63] Continuation-in-part of application No. 09/135,453, Aug. 17, 1998.

[30] Foreign Application Priority Data

May 22, 1998 [TW] Taiwan ................................. 87107992

[51] Int. Cl.$^6$ .......................... H01L 21/44; H01L 21/326; H01L 21/82; H01L 23/48
[52] U.S. Cl. .......................... 438/666; 438/669; 438/468; 438/927; 438/957; 438/128; 438/761; 438/385; 438/598; 438/622; 257/773; 257/775; 257/774; 257/536
[58] Field of Search ..................................... 438/666, 927, 438/957, 468, 669, 128, 761, 385, 598, 622; 257/773, 536, 775, 774

[56] References Cited

U.S. PATENT DOCUMENTS

| | | | |
|---|---|---|---|
| 5,101,261 | 3/1992 | Maeda .................................... | 357/68 |
| 5,289,036 | 2/1994 | Nishimoto ............................... | 257/774 |
| 5,461,260 | 10/1995 | Varker et al. ........................... | 257/773 |
| 5,708,291 | 1/1998 | Bohr et al. ............................. | 257/529 |
| 5,739,587 | 4/1998 | Sato ....................................... | 257/758 |
| 5,789,587 | 4/1998 | Sato ....................................... | 257/758 |
| 5,789,783 | 8/1998 | Choundhury et al. .................. | 257/355 |

*Primary Examiner*—John F. Niebling
*Assistant Examiner*—Neal Berezny
*Attorney, Agent, or Firm*—Thomas, Kayden, Horstemeyer & Risley, LLC

[57] ABSTRACT

A method of fabricating an interconnect structure having improved electromigration resistance. Two conductive lines are formed over a substrate and isolated by a dielectric layer. A contact/via array including a plurality of row contact/vias and column contact/vias are formed within the dielectric layer and electrically connect to the two conductive lines. The load resistors are respectively inserted into the two conductive lines close to the contact/via array. The load resistors are parallel to each other and disposed to its corresponding contact/via array. The load resistors having various resistances are formed by a plurality of slots with various lengths, which are filled with dielectrics. Accordingly, the current paths from one conductive line to the other conductive line through the contact/vias and the load resistors corresponding to the two conductive lines have identical equivalent resistance.

4 Claims, 3 Drawing Sheets

METHOD OF MAKING AN INTERCONNECT STRUCTURE EMPLOYING EQUIVALENT RESISTANCE PATHS TO IMPROVE ELECTROMIGRATION RESISTANCE

CROSS-REFERENCE TO RELATED APPLICATION

This application is a continuation in part (CIP) of U.S. patent application Ser. No. 09/135,453, filed Aug. 17, 1998, which claimed the priority benefit of Taiwan application serial no. 87107992, filed May 22, 1998, the full disclosure of which is incorporated herein by reference.

BACKGROUND OF THE INVENTION

1. Field of the Invention

The invention relates to an interconnect structure in an integrated circuit, and more particularly to a method of improving electromigration (EM) resistance by modifying the interconnect structure.

2. Description of the Related Art

Integrated circuits are made of devices, such as field effect transistors (FETs) and bipolar devices, formed in and on a semiconductor substrate, and the multilevel interconnect structures that form connections to and between the various devices in and on the semiconductor substrate. Many integrated circuits include closely spaced arrays of devices that are accessed by and connected to one or more arrays for parallel wiring lines formed above the substrate and the devices. Arrays of closely spaced wiring lines are a familiar feature of integrated circuit memories because of the regularity of these circuits. Such memories include nonvolatile memories like ROM, EEPROM and flash EEPROM, dynamic random access memories (DRAM) and static random access memories. Because of the requirements of routing interconnects efficiently while using as few layers of interconnects as possible, parallel arrays of wiring lines are also featured in digital signal processors, microprocessors and even more random sorts of logic circuits.

Conductive lines are very often coupled with the silicon diffusion regions or other conductive lines by a contact/via. As mentioned above, because of the requirement that there be as few layers of multilevel interconnects as possible, the contacts/vias are in a form of an N×M via/contact array. Considering an even distribution condition, each contact/via carries a current flow of 1/N×M of the total input current. However, in practical use, due to the different conductive paths, the equivalent resistance of each contact/via is different, so that the current flowing through each contact/via is different. As a consequence, the contact/via having a larger equivalent resistance received a smaller current, and the contact/via having a smaller equivalent resistance receives a larger current. For the contact/via receiving a larger current, the EM lifetime is shorter.

Normally, the contacts/vias are designed perpendicular to the conductive lines. In FIG. 1, a conventional vertical contact/via array is shown. The current flows into conductive line M1 through the contact/via $A_{11}$, $A_{12}$, $A_{13}$ and $A_{14}$ to the conductive line M2.

In FIG. 2, an equivalent circuit of the structure shown in FIG. 1 is shown. Assume that a resistor r exists between each contact/via $A_{11}$, $A_{12}$, $A_{13}$ and $A_{14}$, and the resistance of each contact/via $A_{11}$, $A_{12}$, $A_{13}$ and $A_{14}$ is $r_c$. When the total current flowing into conductive line M1 is I, the relationship between the currents $I_1$, $I_2$, $I_3$ and $I_4$ respectively flowing through each contact via $A_{11}$, $A_{12}$, $A_{13}$ and $A_{14}$ is represented as:

$$I_1 = \left[\left(1+\frac{r}{r_c}\right)^3 + 2\left(\frac{(1+r/r_c)r}{r_c}\right) + \frac{r}{r_c}\right]I_4$$

$$I_2 = \left[\left(1+\frac{r}{r_c}\right)^2 + \frac{r}{r_c}\right]I_4$$

$$I_3 = \left(1+\frac{r}{r_c}\right)I_4$$

Assuming that $r/r_c=0.05$, $I_1/I_4=1.31$, $I_2/I_4=1.15$, and $I_3/I_4=1.05$. The current carried by the contact/via $A_{11}$ is 1.31 times the current carried by the contact/via $A_{14}$. According to Black's Equation, the electromigration lifetime is inversely proportional to the square of the current carried by a contact/via. Therefore, the EM lifetime of the contact/via $A_{11}$ is only $(1/1.31)^2 \approx 0.58$ times the EM lifetime of the contact/via $A_{14}$.

In FIG. 3, a 4×4 vertical contact/via array is shown. A total current flows from the conductive lines M1 through the contact/via array composed of $A_{11}$, $A_{12}$, ..., $A_{44}$ to the conductive lines M2. Similarly, each of the contact/via $A_{11}$, $A_{12}$, ..., $A_{44}$ carries a current in accordance with the relation shown above. After normalization, the current $I_{11}$, $I_{12}$, ..., $I_{44}$ carried by each contact/via $A_{11}$, $A_{12}$, ..., $A_{44}$ in the contact/via array is:

$$\begin{bmatrix} I_{11} & I_{12} & I_{13} & I_{14} \\ I_{21} & I_{22} & I_{23} & I_{24} \\ I_{31} & I_{32} & I_{33} & I_{34} \\ I_{41} & I_{42} & I_{43} & I_{44} \end{bmatrix} = \begin{bmatrix} 1.39 & 1.19 & 1.09 & 1.03 \\ 1.19 & 1.05 & 0.96 & 0.91 \\ 1.09 & 0.96 & 0.87 & 0.83 \\ 1.03 & 0.91 & 0.83 & 0.79 \end{bmatrix}$$

As shown above, the ratio of current carried by the contact/via $A_{44}$ with a longest conductive path to the contact/via $A_{11}$ with a shortest conductive path is about $0.79/1.39 \approx 1/1.76$. Consequently, in comparison with an even distribution condition, the EM lifetime is only about $(1/1.35)^2 \approx 55\%$.

SUMMARY OF THE INVENTION

It is therefore an object of the invention to provide an interconnect structure, thereby improving electromigration resistance. A proper load resistor is added between each contact/via and a conductive line, so that a current path from one conductive line to another conductive line through each contact/via and the load resistors has identical equivalent resistances. Therefore, as the current distributed into each contact/via is the same, the electromigration resistance of each contact/via is uniform. The EM lifetime of the whole conductive structure is enhanced.

To achieve these objects and advantages, and in accordance with the purpose of the invention, as embodied and broadly described herein, the invention is directed towards a method of fabricating an interconnect structure. Two conductive lines are formed over a substrate and isolated by a dielectric layer. A contact/via array including a plurality of row contact/vias and column contact/vias is formed within the dielectric layer and electrically connect to the two conductive lines. The load resistors are respectively inserted into the two conductive lines close to the contact/via array. The load resistors are parallel to each other and each is disposed with its corresponding contact/via array. The load resistors with various resistances are formed by a plurality of slots with various lengths, which are filled with dielectrics.

It is to be understood that both the foregoing general description and the following detailed description are exemplary and explanatory only and are not restrictive of the invention, as claimed.

BRIEF DESCRIPTION OF THE DRAWINGS

FIG. 6 is a schematic, cross-sectional view illustrating the interconnect structure taken along line 6-6' in FIG. 4; and.

DESCRIPTION OF THE PREFERRED EMBODIMENTS

In a preferred embodiment according to the invention, an interconnect structure with two conductive lines is provided. A load resistor is added between each contact/via and each conductive line, so that the equivalent resistance including the load resistor and the two conductive lines thereof is identical to achieve the uniformity of the current flow. Therefore, the EM lifetime of each contact/via is enhanced. A detailed description of the invention is presented in the following paragraphs with accompanying drawings FIG. 4, FIG. 5, FIG. 6 and FIG. 7.

Figure 1:
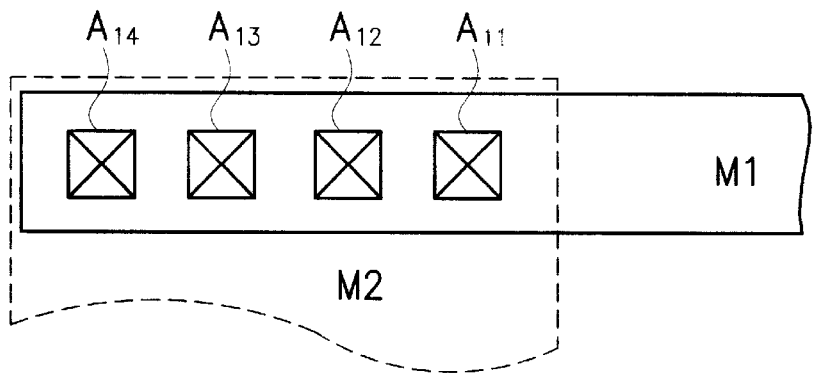
FIG. 1 shows a conventional structure of conductive lines with a 1×4 vertical contact/via array.
Figure 2:
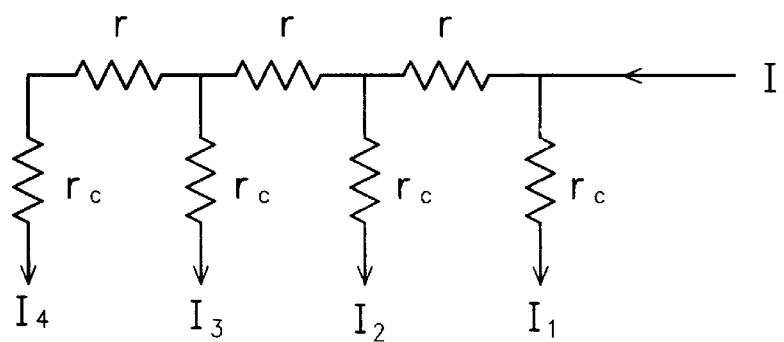
FIG. 2 shows an equivalent circuit of the contact/via array shown in FIG. 1.
Figure 3:
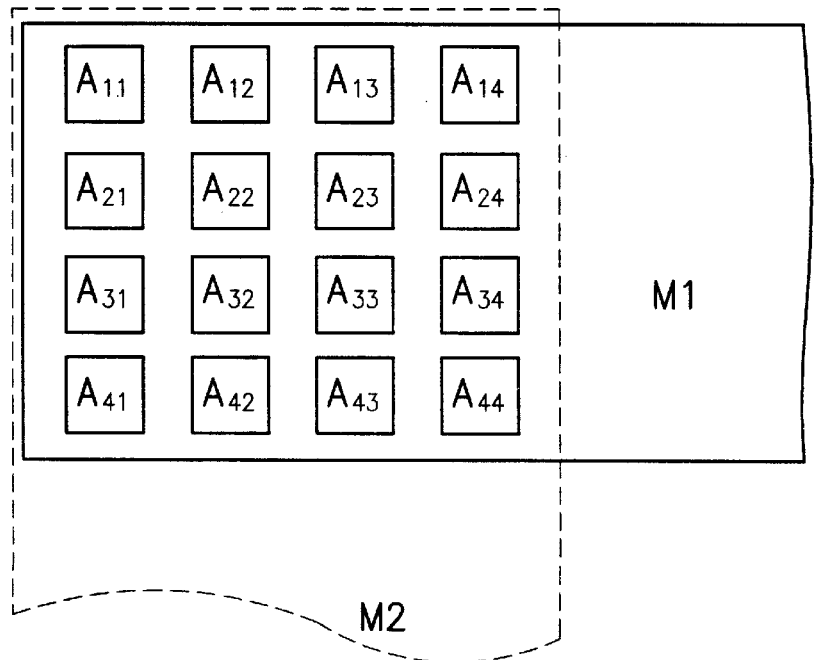
FIG. 3 shows a conventional structure of conductive lines with a 4×4 vertical contact/via array.
Figure 4:
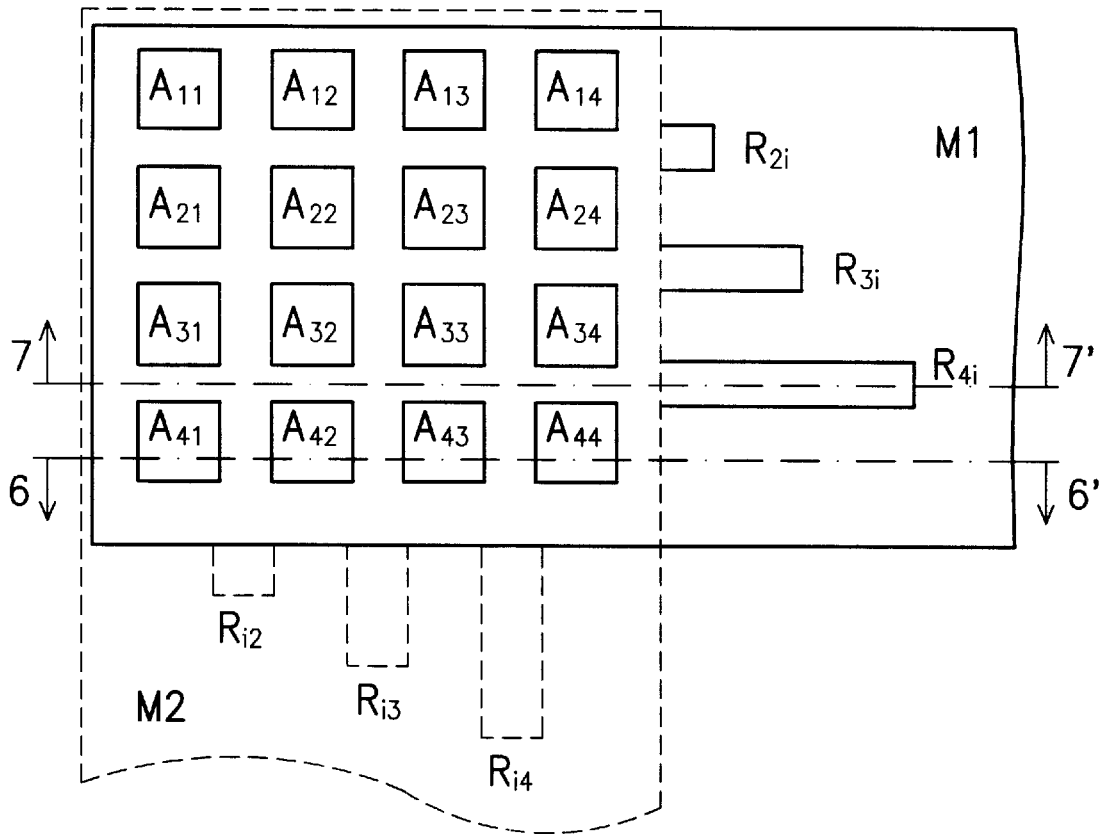
FIG. 4 shows a schematic, top view of conductive lines with a 4×4 vertical contact/via array in a preferred embodiment according to the invention.
Figure 6:
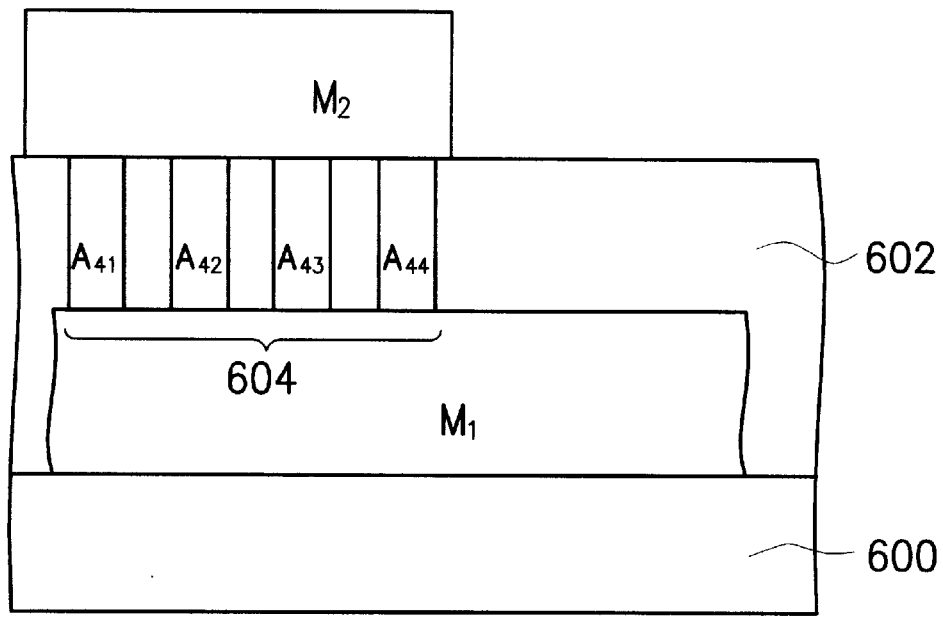
Figure 7:
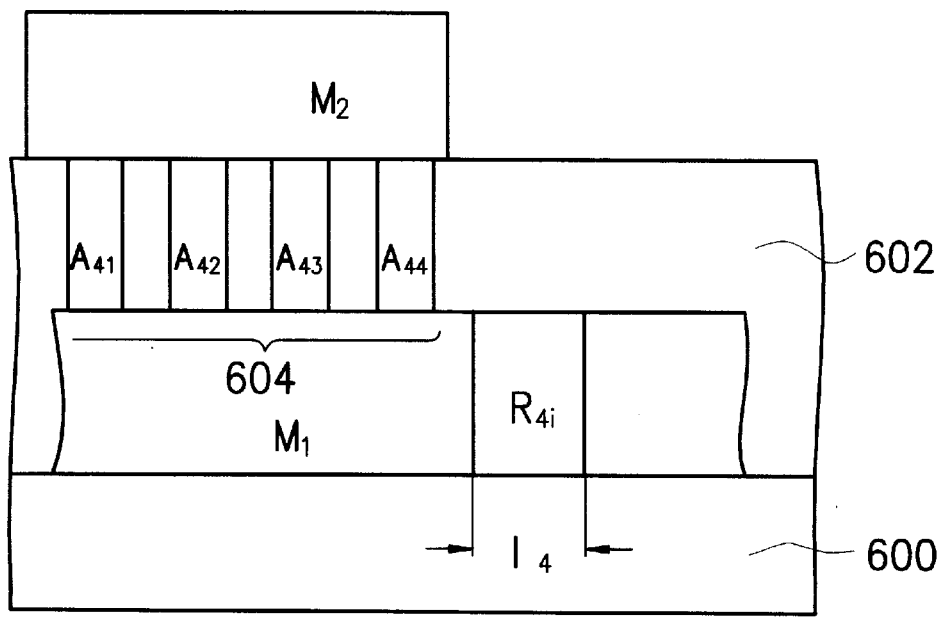
FIG. 7 is a schematic, cross-sectional view illustrating the interconnect structure taken along line 7-7' in FIG. 4.

Referring to FIG. 4, FIG. 6 and FIG. 7, conductive lines M1, M2 are formed over a substrate 600 in which the conductive line M1 is isolated from the conductive line M2 by a dielectric layer 602 on the substrate 600. A 4×4 contact/via array comprising 16 contacts/vias $A_{11}, \ldots, A_{44}$ is formed on the substrate 600 to electrically connect the conductive line M1 and the conductive line M2. According to practical requirement, a load resistor is added to each row and each column of the contacts/vias. As shown in FIG. 4 these load resistors are formed by first forming slots with various length within the conductive line M2 and the conductive line M1 for each corresponding column and row of contacts/vias. For the contact/via rows $A_{1i}$ to $A_{4i}$, slots $R_{2i}$ to $R_{4i}$ are respectively inserted within the conductive line M1 between each of the contact/via rows $A_{1i}$ to $A_{4i}$. For the contact/via column $A_{i1}$ to $A_{i4}$, slots $R_{i2}$ to $R_{i4}$ are respectively inserted within the conductive line M2 between each of the contact/via column $A_{i1}$ to $A_{i4}$. These slots, $R_{2i}$ to $R_{4i}$ and $R_{i2}$ to $R_{i4}$, filled with dielectric material are themselves parallel and respectively extend in the direction that the conductive lines M1, M2 extend. The resistance of the load resistors depends on the current path from conductive line M1 to conductive line M2 through contact/via array. The longer the current path is, the smaller the load resistor is, that is, the shorter the length $l_4$ of the slot is.

Figure 5:
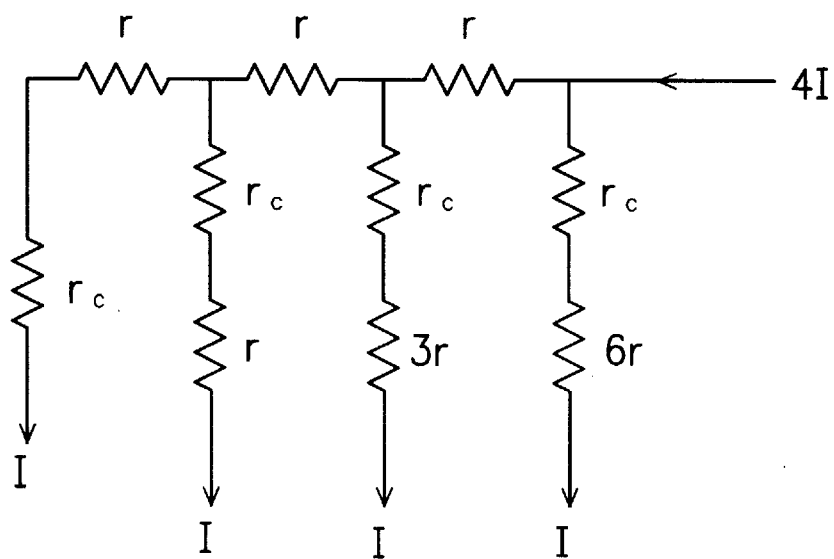
FIG. 5 shows an equivalent circuit of the structure shown in FIG. 4

Assuming that each contact/via $A_{11}, A_{12}, \ldots, A_{44}$ has a resistance of $r_c$, and the conductive layer M1 between each contact/via $A_{11}, A_{12}, \ldots, A_{44}$ has a resistance of r, according to the equivalent circuit shown in FIG. 5, taking the first row as an example, a zero resistance is added to the first contact/via element $A_{11}$ with the highest equivalent resistance due to the longest current path from conductive line M1 to conductive line M2 through $A_{11}$. With the second contact/via element $A_{12}$ having a second highest equivalent resistance, a load resistor with resistance r is serially connected. A load resistor having resistance 3r is serially connected with the third contact/via element $A_{13}$, and a load resistor having resistance 6r is serially connected with the fourth contact/via element $A_{14}$. Since the slots $R_{i2}$ to $R_{i4}$ are disposed within the conductive line M2 between each contact/via columns $A_{11}, \ldots, A_{14}$ to occupy a part of the section area, the current from the contact/via $A_{11}, \ldots, A_4$ passes through different section areas when the current flows through the conductive line M2. Thus, a current path from the conductive line M1 to the conductive line M2 through each of the contact/via $A_{11}, \ldots, A_{14}$ and the load resistor corresponding to the contact/via has an identical equivalent resistance. When a total current of 4I is input into the conductive line M1, each contact/via $A_{11}$ to $A_{14}$ receives a current of I.

FIG. 6 and FIG. 7 are schematic, cross-sectional views illustrating fabrication of an interconnect structure of the preferred embodiment, according to the invention, taken along lines 6-6' and 7-7' in FIG. 4. Referring to FIG. 4, FIG. 6 and FIG. 7, a conductive layer M1 is formed over a substrate 600. Slots including $R_{2i}$, $R_{3i}$ and $R_{4i}$ having varied length $l_2$, $l_3$ and $l_4$ are formed within the conductive line M1. A dielectric layer 602 is formed on the conductive layer M1 to fill the slots $R_{2i}, \ldots, R_{4i}$. A contact/via array $A_{11}$, $A_{12}$, $\ldots, A_{44}$ including a plurality of column contact/vias and a plurality of row contacts/vias are formed within the dielectric layer 602 on a connect region 604 of the conductive line M1. Thereafter, a conductive line M2 is formed on the dielectric layer 602 and electrically connect with the conductive line M1 through the contact/via array $A_{11}$, $A_{12}, \ldots,$ $A_{44}$. Slots including $R_{i2}, \ldots, R_{i4}$ having varied length are formed within the conductive line M2 and filled with dielectric materials.

With the interconnect structure mentioned above, each contact/via in a contact/via array through load resistors carries an identical current. Thus, the EM lifetime inversely proportional to the square of the current is identical for each contact/via. Therefore, the electromigration resistance of the device is enhanced.

It is worth noting that in many fabricating processes, a structure similar to the slots filled with dielectric material in the invention is formed to relieve the stress of the conductive lines. However, the main subject and function are different. Furthermore, the slots in the invention have to be formed under the consideration of an identical equivalent resistance of each contact/via. Therefore, in the invention, the formation of the slots not only provides an equivalent resistance of each contact via, but also provides a way to relieve the stress of the conductive lines.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming an interconnect structure in a semiconductor device having improved electromigration resistance, comprising:

forming two conductive lines over a substrate, of the semiconductor device the two conductive lines being isolated from each other by a dielectric layer;

forming a contact/via array within the dielectric layer to electrically connect the two conductive lines, wherein the contact/via array comprises a plurality of contact/ via columns and a plurality of contact/via rows made up of a plurality of contacts/vias; and respectively forming parallel load resistors having various resistance within the two conductive lines corresponding to each of the contact/via columns and the contact/via rows to displace a part of each two conductive lines close to the contact/via array, so that the current paths from one conductive line to the other conductive line through the contact/vias and the load resistors corresponding to the two conductive lines have identical equivalent resistance.

2. The method according to claim 1, wherein the load resistors comprise a conductive layer and a plurality of slots with various lengths, the slots being filled with dielectric material in the conductive layer.

3. A method of forming an interconnect structure in a semiconductor device having improved electromigration resistance, comprising:

forming a first and a second conductive line over a substrate, of the semiconductor device the two conductive lines being isolated by a dielectric layer;

forming a contact/via array to electrically connect the first and the second conductive lines, wherein the contact/via array comprises a plurality of contact/via columns and a plurality of contact/via rows made up of a plurality of contacts/vias; and respectively inserting a first and parallel load resistors having various resistances into the first and second conductive lines close to the contact/via array corresponding to each of the contact/via columns and the contact/via rows, so that an equivalent resistance composed of the first conductive line, the second conductive line, each first load resistor, each contact/via corresponding to each first load resistor and each second load resistor corresponding to each contact/via is identical.

4. The method according to claim 1, wherein the load resistors comprise a conductive layer and a plurality of slots with various lengths, the slots being filled with dielectric material in the conductive layer.

* * * * *